United States Patent
Chang et al.

(10) Patent No.: US 11,784,616 B2
(45) Date of Patent: Oct. 10, 2023

(54) HIGH EFFICIENCY PHOTOCONDUCTIVE SEMICONDUCTOR SWITCH-BASED AMPLIFIER FOR HIGH POWER MICROWAVE TRANSMISSION

(71) Applicants: Lawrence Livermore National Security, LLC, Livermore, CA (US); SoCal Simulations, LLC, Sacramento, CA (US)

(72) Inventors: Tammy Chang, San Ramon, CA (US); Adam Conway, Livermore, CA (US); Victor Valeryevich Khitrov, San Ramon, CA (US); Lars Voss, Livermore, ID (US); Benjamin Fasenfest, Redding, CA (US); Peter Asbeck, Del Mar, CA (US)

(73) Assignees: LAWRENCE LIVERMORE NATIONAL SECURITY, LLC, Livermore, CA (US); SOCAL SIMULATIONS, LLC, Sacramento, CA (US)

(*) Notice: Subject to any disclaimer, the term of this patent is extended or adjusted under 35 U.S.C. 154(b) by 263 days.

(21) Appl. No.: 17/202,691

(22) Filed: Mar. 16, 2021

(65) Prior Publication Data
US 2022/0069785 A1 Mar. 3, 2022

Related U.S. Application Data

(60) Provisional application No. 63/072,885, filed on Aug. 31, 2020.

(51) Int. Cl.
*H03F 3/191* (2006.01)
*H03F 3/24* (2006.01)
(Continued)

(52) U.S. Cl.
CPC ............ *H03F 3/245* (2013.01); *H03F 1/565* (2013.01); *H03F 3/195* (2013.01);
(Continued)

(58) Field of Classification Search
CPC ...................................................... H03F 3/191
(Continued)

(56) References Cited

U.S. PATENT DOCUMENTS

| | | | |
|---|---|---|---|
| 8,829,995 B2* | 9/2014 | Cohen | H03F 3/45183 330/253 |
| 9,024,691 B2* | 5/2015 | Banerjee | H03F 3/191 330/305 |
| 2016/0072456 A1* | 3/2016 | Lin | H03F 3/191 330/303 |

OTHER PUBLICATIONS

Chen, J. et al. "Design of Highly Efficient Broadband Class-E Power Amplifier Using Synthesized Low-Pass Matching Networks." IEEE Trans. on Microwave Theory and Techniques, 2011. 59(12).

(Continued)

*Primary Examiner* — Henry Choe
(74) *Attorney, Agent, or Firm* — Perkins Coie LLP

(57) ABSTRACT

Power amplifier apparatuses and techniques for optimizing the design of power amplifiers are disclosed. In one aspect, a method for optimizing a power amplifier includes selecting a circuit topology for the power amplifier. The circuit topology includes one or more photoconductive switches and an impedance matching network including one or more parameter values representative of the impedance matching network or the photoconductive switches that can be adjusted. The method further includes selecting one or more optimization goals for the impedance matching network and the one or more photoconductive switches, and adjusting the one or more parameter values according to the one or more
(Continued)

optimization goals. The one or more optimization goals include an efficiency at a particular power output.

18 Claims, 13 Drawing Sheets

(51) Int. Cl.
    *H03F 1/56*     (2006.01)
    *H03F 3/195*     (2006.01)

(52) U.S. Cl.
    CPC .. *H03F 2200/318* (2013.01); *H03F 2200/421* (2013.01); *H03F 2200/423* (2013.01)

(58) Field of Classification Search
    USPC .................................................. 330/302, 305
    See application file for complete search history.

(56) References Cited

OTHER PUBLICATIONS

Duan, B.X. et al. "A Development Summarization of the Power Semiconductor Devices." IEEE Technical Review, 2011. 28(6): p. 503-510.

Grivickas, P. et al. "Probing of carrier recombination in n- and p-type 6H-SiC using ultrafast supercontinuum pulses," Materials Science Forum 821-823, p. 245 (2015).

Huang, C.J. "Opto-electronic class AB microwave power amplifier using photoconductive switch technology," Thesis, University of Missouri—Columbia, 2006.

Huang, C.J. et al. "Optoelectronic Class AB Microwave Power Amplifier," in Conference Record of the 2006 Twenty-Seventh International Power Modulator Symposium, May 2006, pp. 146-149.

James, C. et al. "Design and Evaluation of a Compact Silicon Carbide Photoconductive Semiconductor Switch," IEEE Trans. on Electron Devices 58, p. 508 (2011).

Kelkar, K.S. et al. "Design and characterization of silicon carbide photoconductive switches for high field applications," J. Appl. Phys., 100, p. 124905 (2006).

Mazumder, S.K. "An Overview of Photonic Power Electronic Devices," IEEE Trans. on Power Electronics 31, p. 6562 (2016).

Millan, J. et al. "A Survey of Wide Bandgap Power Semiconductor Devices." IEEE Trans. on Power Electronics, 29(5): p. 2155-2163 (2014).

O'Connell, R.M. et al. "Optoelectronic Microwave Power Amplifiers," IEEE Trans. Dielectrics and Electrical Insulation, vol. 14, No. 4, pp. 994-1001, Aug. 2007.

Raab, F.H. "Class-E-C and F power amplifiers based upon a finite No. of harmonics," IEEE Trans. Microwave Theory Tech., vol. 49, No. 8, pp. 1462-1468, Aug. 2001.

Raynaud, C. et al. "Comparison of high voltage and high temperature performances of wide bandgap semiconductors for vertical power devices." Diamond and Related Materials, 2010. 19(1): p. 1-6.

Wu, Q. et al. "Initial Test of Optoelectronic High Power Microwave Generation From 6H-SiC Photoconductive Switch," IEEE Electron Device Lett., vol. 40, No. 7, pp. 1167-1170, Jul. 2019.

\* cited by examiner

HIGH EFFICIENCY PHOTOCONDUCTIVE SEMICONDUCTOR SWITCH-BASED AMPLIFIER FOR HIGH POWER MICROWAVE TRANSMISSION

CROSS REFERENCE TO RELATED APPLICATIONS

This patent document claims the benefit of priority to U.S. Patent Application No. 63/072,885, filed on Aug. 31, 2020. The entire contents of the before-mentioned patent application is incorporated by reference as part of the disclosure of this application.

STATEMENT REGARDING FEDERALLY SPONSORED RESEARCH OR DEVELOPMENT

The United States Government has rights in this invention pursuant to task number 46511/L21772 under the PANTHER project between the Office of Naval Research and Lawrence Livermore National Security, LLC.

TECHNICAL FIELD

This present disclosure is related to high-power power amplifiers.

BACKGROUND

High-power microwave signals are used for many applications including communications, radar, medical equipment, and many others. These high-power microwave signals can be generated using a klystron, magnetron, or by solid-state devices. Solid-state devices can be configured to generate microwave signals but amplification to high power using solid-state power amplifiers is challenging. New techniques are needed for generating high-power microwave signals using solid-state devices.

SUMMARY

The technology disclosed in this patent document includes specific power amplifier devices and systems, and methods for optimizing a power amplifier design. Specifically, the disclosed technology can be implemented to design and construct a microwave power amplifier that is optimized according to optimization goals including high efficiency.

The disclosed techniques and devices allow the use of an electro-optically modulated laser excitation to modulate the conductivity of a photoconductive semiconductor switch (PCSS) device in a linear mode and to dynamically reconfigure a transmitted microwave waveform based on an electrical signal input to an electro-optic modulator.

The disclosed design techniques for optimizing the design of high-power optoelectronic amplifiers include a harmonic-based design optimization process to design PCSS-based amplifiers for high efficiency.

In one aspect, a method for optimizing a power amplifier includes selecting a circuit topology for the power amplifier. The circuit topology includes one or more photoconductive switches and an impedance matching network including one or more parameter values representative of the impedance matching network or the photoconductive switches that can be adjusted. The method further includes selecting one or more optimization goals for the impedance matching network and the one or more photoconductive switches and adjusting the one or more parameter values according to the one or more optimization goals. The one or more optimization goals include an efficiency at a particular power output.

In another aspect, a method for optimizing a power amplifier includes determining an impedance of an impedance matching network at a fundamental frequency and a plurality of harmonics of the fundamental frequency. The method further includes determining a conductivity for each of one or more photoconductive switches at the fundamental frequency and the plurality of harmonics. The method includes determining an output voltage and a power amplifier power consumption using a harmonic balance approach. The method further includes adjusting one or more parameter values representative of the impedance of the impedance matching network, the conductivity for each of the one or more photoconductive switches, the output voltage, or the power amplifier power consumption according to one or more optimization goals.

In another aspect, a microwave power amplifier apparatus is disclosed. The microwave power amplifier includes one or more photoconductive switches, and an optical source carrying an optical signal coupled to the one or more photoconductive switches, wherein the optical signal is transformed to an electrical signal by the one or more photoconductive switches. The apparatus further includes an impedance matching network comprising a plurality of circuit elements connected with the one or more photoconductive switches in a circuit topology. The one or more parameter values characterize at least a portion of the circuit elements and the one or more photoconductive switches, and the one or more parameter values are selected to achieve one or more optimization goals.

BRIEF DESCRIPTION OF THE DRAWINGS

Where possible, like reference numbers refer to the same or similar features in the drawings.

DETAILED DESCRIPTION

Figure 1A:
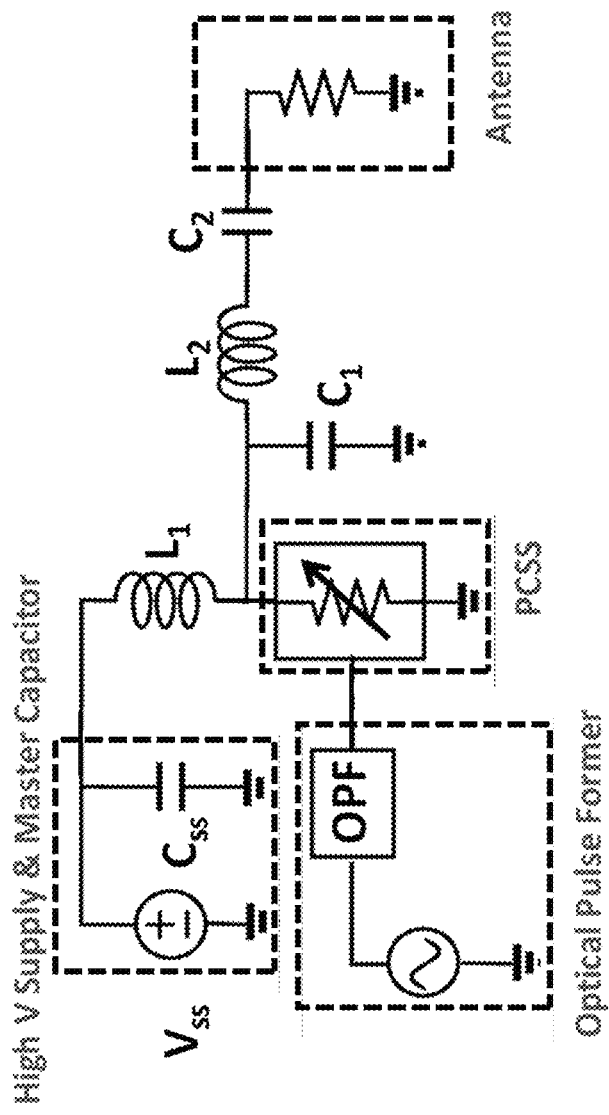
FIG. 1A depicts an example of a power amplifier topology with a class E style matching network.

The disclosed photoconductive semiconductor switch (PCSS)-based amplifier design and design techniques may be applied to vastly improve the efficiency of radio frequency (RF), microwave, and millimeter-wave power amplifiers for radar, communications, as well as many other applications. Because of the need for systems to operate at a high duty cycle including a long pulse width relative to pulse period, thermal handling becomes challenging but can be addressed with the disclosed highly efficient HPM generation where very little power is dissipated as heat. The disclosed design techniques and the devices that result from the design techniques optimize amplifier efficiency for a desired output waveform and output power.

PCSSs with sub-nanosecond switching speeds and high voltage handling capability can be used for high power microwave (HPM) generation. PCSS-based systems offer a configurable frequency capability in contrast to wideband and narrowband counterparts such as klystrons, magnetrons, and superluminal sources. In previous systems, the efficiency of PCSS-based HPM systems has been low due to the required optical power and high resistivity of typical semiconductor switches. The disclosed devices and design techniques overcome these problems.

An example of a device designed using the disclosed techniques is a high-efficiency and narrowband, 1 GHz module which can exceed 100 kW output power. The device is a class-E switch mode amplifier with an efficiency of greater than 70%. The response time of the switch and thus the operating frequency may be governed by the recombination time of the electron (hole) back into the V level. This carrier lifetime is a function of the concentration of dopant atoms (e.g., Vanadium). In some example embodiments, lifetimes on the order of 30 ps are possible enabling an operating frequency of about 10 GHz. The switch module functions as: an optical to electrical interface, an optoelectronic power amplifier, an energy storage device, and a thermal management device.

In order to increase the drain efficiency of a class A amplifier, the overlap of voltage and current within the switch should be minimized. Control over the harmonic content of the waveforms facilitates minimizing the voltage and current overlap. Different classes of amplifiers yield different characteristics of the amplified signal and device efficiency. Class AB, B, C, E, and F power amplifier performance can be analyzed considering a large or infinite number of controlled harmonics and their respective ideal impedance terminations at the harmonics. However, device parasitic elements may impose a significant limitation for transient power amplifier operation. Accordingly, harmonic approximation may be used by using a finite number of controlled harmonics. For these amplifiers, the ideal efficiency increases with properly phased harmonic content as shown in Table 1. The harmonic content is generated as a result of undesirable nonlinear operation of the amplifying device. For high efficiency, the harmonics should be reflected before reaching the load and their energy content recycled within the power amplifier.

TABLE 1

Efficiencies of amplifiers with different harmonic content.

| | Harmonic Number | | | | |
|---|---|---|---|---|---|
| | 1 (class A) | 2 | 3 | 4 | 5 |
| Ideal drain efficiency % | 50 | 71 | 82 | 87 | 91 |
| Power output capability | 0.125 | | 0.144 | | 0.151 |

Figure 1B:
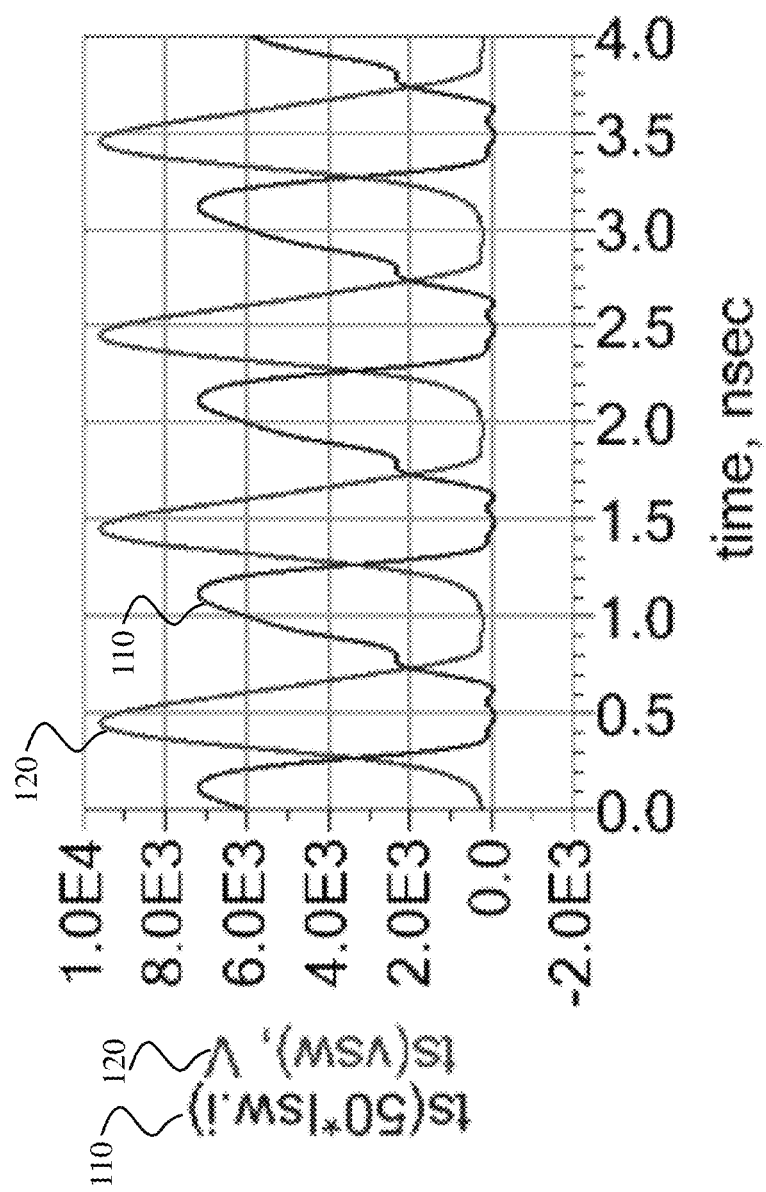
FIG. 1B depicts example waveforms showing the switch voltage and switch current for the amplifier topology in FIG. 1A.

With switching amplifiers, it is desirable to achieve zero voltage switching (ZVS) and zero current switching (ZCS) conditions when the switch opens and closes, in order to avoid losses associated with circuit capacitances and inductances. Class E and inverse class F amplifier configurations have been developed to approximate these conditions. The guidelines for amplifier efficiency enhancement apply to PCSS operation even if PCSS switches differ from that of an ideal switch. FIG. 1A depicts an example in which a class E-style matching network is used based on a parallel circuit design. This design employs two resonant L-C circuits which can also be implemented with transmission lines and capacitors. Example waveforms showing switch voltage (120) and current (110) are shown in FIG. 1B. As a result of their limited overlap, the drain efficiency reaches about 70%. Higher efficiency is also possible. In order to produce proper switching operation in the example of FIG. 1A, the optical input produces a conductivity which has sharp transitions, and harmonic content up to 3 GHz, which in turn drives the harmonic content of the switch output. In some example embodiments, the resistance of the switch is designed to go as low as $R_{min}=2$ ohms (in comparison with the 70-ohm load).

The overall system efficiency depends at least in part on both the drain efficiency of the power amplifier, and the efficiency of the laser pulse generation and the optical-to-electronic conversion. To optimize the design, tradeoffs between the two are considered. Electrical efficiency is highest if the PCSS achieves very high conductivity including a low $R_{min}$ and when the PCSS response time is very short, but these conditions can be costly in terms of optical energy. The frequency-dependent switch conductance G depends on the optical drive power $P_{opt}$ according to the following:

$$G(\omega) = \mu \tau_r q P_{opt} h\nu/L^2/(1+j\omega\tau_r) \quad \text{Equation 1}$$

where $\tau_r$ is the recombination lifetime of the photogenerated carriers, p is the effective mobility and L is the photoconductor length which is set by breakdown voltage requirements. In order to increase the bandwidth of the photoconductance, $\tau_r$ can be decreased which also leads to an increase in optical power $P_{opt}$ after optimization of the photoconductive material.

The trade-offs in the example of FIG. 1A include, if $R_{min}=40$ ohms is used, due to reduced photoconductivity bandwidth, simulated drain efficiency is 47%, but the optical power requirements are significantly reduced and may lead to overall reduced size, weight, and power (SWaP). The design includes design of the power amplifier matching network, antenna, switch and supply capacitor bank, and includes impedances at both fundamental and harmonic frequencies.

The disclosed design techniques and devices for high-power optoelectronic amplifiers include: 1) harmonic-based design optimization process to design PCSS-based amplifiers for high efficiency; 2) a specific design including a vanadium-doped silicon carbide PCSS amplifier. In a particular embodiment the design has an electrical efficiency, η, of 70-80% for greater than 1 megawatt (MW) of output power.

The disclosed techniques and devices allow the use of electro-optically modulated laser excitation to modulate the conductivity of the PCSS device in a linear mode and to dynamically reconfigure the transmitted microwave waveform based on the electrical signal input into the electro-optic modulator. An arbitrary waveform generator or other signal generator with, for example, data modulated onto the electrical signal, radar waveform, or other waveform, can be used to provide the input electrical signal.

An example circuit topology for a PCSS-based amplifier includes a high voltage supply, an optical waveform generator, and a photoconductive switch. These components can be configured in various amplifier configurations such as classes AB, B or E. A class E power amplifier example is shown in FIG. 1A. In the disclosed design process, the values of the circuit elements are selected by the process further detailed with respect to FIG. 6 to optimize the power efficiency of the complete circuit.

Figure 2A:
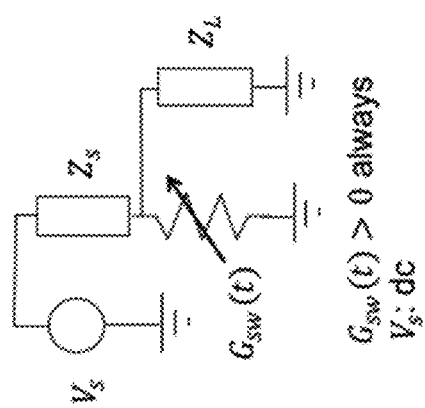
FIG. 2A depicts an example of a circuit topology.
Figure 2B:
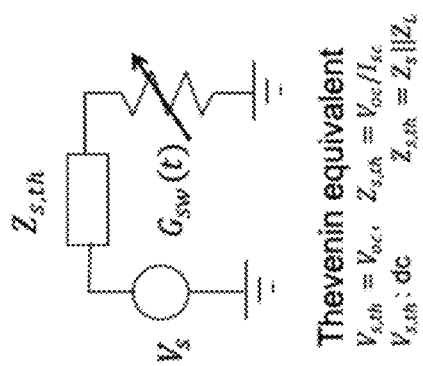
FIG. 2B depicts an example of a Thevenin equivalent circuit to the circuit in FIG. 2A.

In the disclosed design process, a power amplifier has a conductance that is modulated. See, for example, FIGS. 2A-2C. FIG. 2A depicts an example of an implemented circuit topology and FIG. 2B depicts a Thevenin equivalent circuit to FIG. 2A based on circuit theory where $V_{oc}$ is the open circuit voltage and $I_{sc}$ is the short circuit current at the switch and $G_{sw}(t)$ is the conductance of the switch as a function of time. In this example, the impedance elements of the surrounding circuit can be broken into harmonics where impedance values are measured at a fundamental frequency and at harmonic frequencies of the fundamental. The circuit component values are then optimized according to the following: from switch conductivity waveform $G_{sw}(t)$, find $G_L$ and $B_L$ at the fundamental frequency and at the harmonic frequencies to maximize the output power, efficiency, gain, bandwidth, and/or other performance parameters.

Figure 2C:
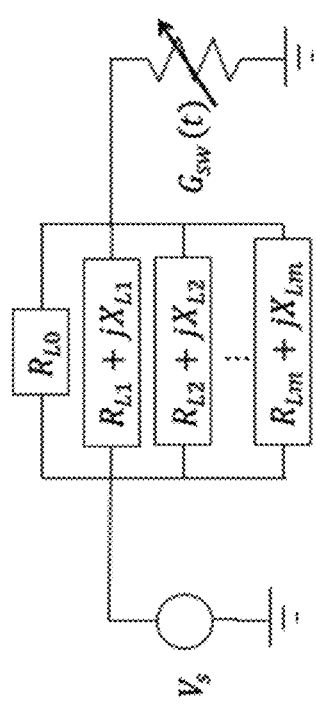
FIG. 2C depicts an example of a Thevenin equivalent circuit showing impedance as a function of frequency.

FIG. 2C depicts a Thevenin equivalent circuit showing impedance as a function of frequency from DC (m=0, zero frequency) to the $m^{th}$ harmonic.

For a $G_{sw}(t)$ that is periodic over time, the switch conductance, voltage, and current can be constructed according to:

$$G_{sw}(t) = G_0 + \frac{1}{2}\sum_{n=1}^{\infty} G_n(\omega)e^{jn\omega t} + c.c.). \quad \text{Equation 2}$$

$$V_{sw}(t) = V_0 + \frac{1}{2}\sum_{n=1}^{\infty} V_n(\omega)e^{jn\omega t} + c.c.). \quad \text{Equation 3}$$

$$I_{sw}(t) = I_0 + \frac{1}{2}\sum_{n=1}^{\infty} I_n(\omega)e^{jn\omega t} + c.c.). \quad \text{Equation 4}$$

where the conditions include:

$$I_{sw}(\omega) = -I_L(\omega) \text{ for } \omega \neq 0 \quad \text{Equation 5.}$$

$$I_L(\omega=0) = 0 \text{ for efficiency considerations.} \quad \text{Equation 6.}$$

$$Y_{L1} = G_{L1} + jB_{L1} \quad \text{Equation 7.}$$

$$Y_{Lm} = jB_{Lm} \text{ for } m \neq 1, \text{leading to } I_m = Y_{Lm}V_m \quad \text{Equation 8.}$$

If $B_{Lm}$ is very large, $V_m \approx 0$ \quad \text{Equation 9.}

The conductance relationship for the switch $I_{sw} = G_{sw}V_{sw}$ and the following relations at DC as well as at the fundamental and higher order harmonics of the fundamental hold:

$$I_0 = G_0V_0 + \frac{1}{4}\sum_m (G_mV_m^* + G_m^*V_m). \quad \text{Equation 10}$$

$$I_1 = G_0V_1 + G_1V_0 + \frac{1}{2}G_2V_1^* + \frac{1}{2}G_3V_2^* + \frac{1}{2}G_4V_3^* + \ldots . \quad \text{Equation 11}$$

$$I_2 = G_0V_2 + \frac{1}{2}G_1V_1 + G_2V_0 + \frac{1}{2}G_3V_1^* + \frac{1}{2}G_4V_2^* + \frac{1}{2}G_5V_3^* + \ldots . \quad \text{Equation 12}$$

and so on.

By requiring that $Y_{Lm} = jB_{Lm}$ for $m \neq 1$, the following relations also hold:

$$I_1 = (G_{L1} + jB_{L1})V_1 \quad \text{Equation 13.}$$

$$I_2 = jB_{L2}V_2 \quad \text{Equation 14.}$$

$$I_3 = jB_{L3}V_3 \quad \text{Equation 15.}$$

and so on.

Features of the solution include the DC power dissipation $P_{dc} = V_0I_0$, the RF power dissipation at the fundamental frequency $$P_{rf,0} = \frac{1}{2}G_{L1}|V_1|^2,$$

and optical power input $$P_{in,opt} = const \cdot \int_0^T G_{sw}(t) \cdot dt/T.$$

These parameters are used as metrics for the selected optimization routine (particle swarm, genetic, gradient-based, etc.) to determine the load impedances required to achieve satisfactory amplifier performance.

Using the foregoing design process, a particle swarm optimizer can be used to determine the required harmonic impedances for a photoconductive switch with specific characteristics, such as a 100-micron thick vanadium doped silicon carbide photoconductive switch. Components with the corresponding impedances can be incorporated into an electromagnetic design that can be simulated and evaluated in a full-wave electromagnetic solver.

Figure 3A:
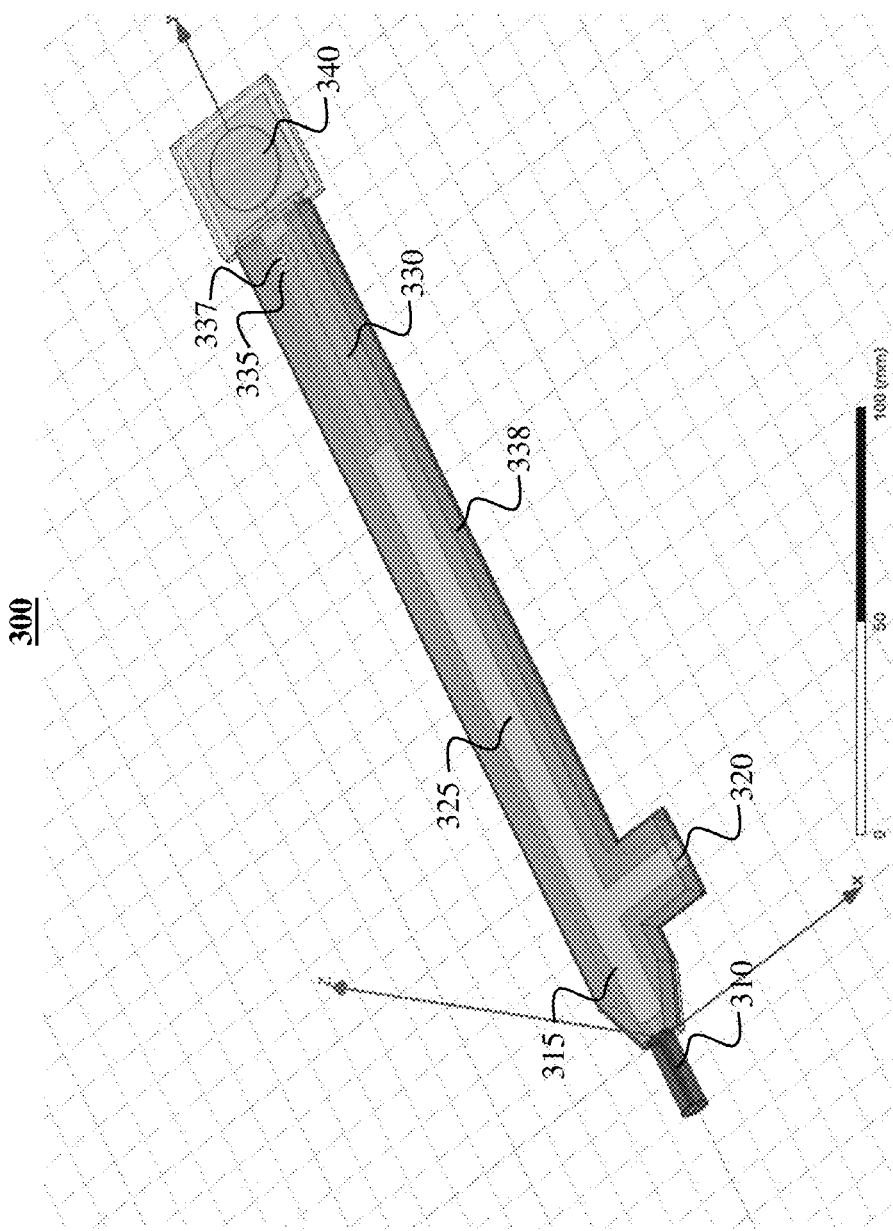
FIG. 3A depicts an example of a conductance modulated amplifier including a stacked double switch.

FIG. 3A depicts an example 300 of a conductance modulated amplifier that was designed using the disclosed methodology and includes a double stacked switch. In the example of FIG. 3A, microwave output power is produced at output port 310. Capacitor bank 340 is charged by a high voltage power supply. Photoconductive switches 335 are connected to ground on a first side of each switch and the second side of each switch is connected to the signal conductor of stripline transmission line 330. The signal conductor of stripline transmission line 330 is connected to the high voltage power supply. The first side of the top switch is connected to ground through post 337 which makes ground contact to conductive enclosure 338. The second switch located on the other side of the trace also has a post (not shown) which makes ground contact to conductive enclosure 338. One or both of the switches can be switched by an optical signal (not shown in FIG. 3A) coupled to the photoconductive switches 335. Stripline transmission line 330 is capacitively coupled to stripline transmission line 325. A stub tuner 320 is positioned at the junction of stripline transmission line 325 and stripline transmission line 315. Stripline transmission line 325 and stripline transmission line 315 may be considered as two transmission lines with stripline transmission line 325 having a first length connected in series with stripline transmission line 315 having a second length and stub tuner 320 centered at the junction of 315 and 325. Alternatively, stripline transmission line 325 and stripline transmission line 315 may be considered to be single stripline transmission line having a length equal to the first length added to the second length with stub tuner 320 centered at the first length from the end of 325 and/or the second length from the end of 315. Ignoring losses, stub tuner 320 provides a reactive load at the location of the stub with a reactance value, and thus a corresponding line length, determined by the design optimization process described in this patent document. Output port 310 is coupled to stripline transmission line 315. Although transmission lines 315, 320, 325, and 330 are stripline transmission lines in FIG. 3A, one or more of the transmission lines can be any other transmission line configuration such as a microstrip transmission line, coplanar waveguide, or other transmission line configuration. Transmission lines 315, 320, 325, and/or 330 can be different transmission line configurations. In some implementations, the lengths of the transmission lines, impedances of the transmission lines, position of the stub tuner, impedance of the stub tuner, and length of the stub tuner are optimized by the disclosed optimization process. The circuit in FIG. 3A is placed into a conductive enclosure 338 that is connected to the AC ground and DC ground for the circuit and contains an insulating fluid which increases the voltage handling capability of the circuit.

Figure 3B:
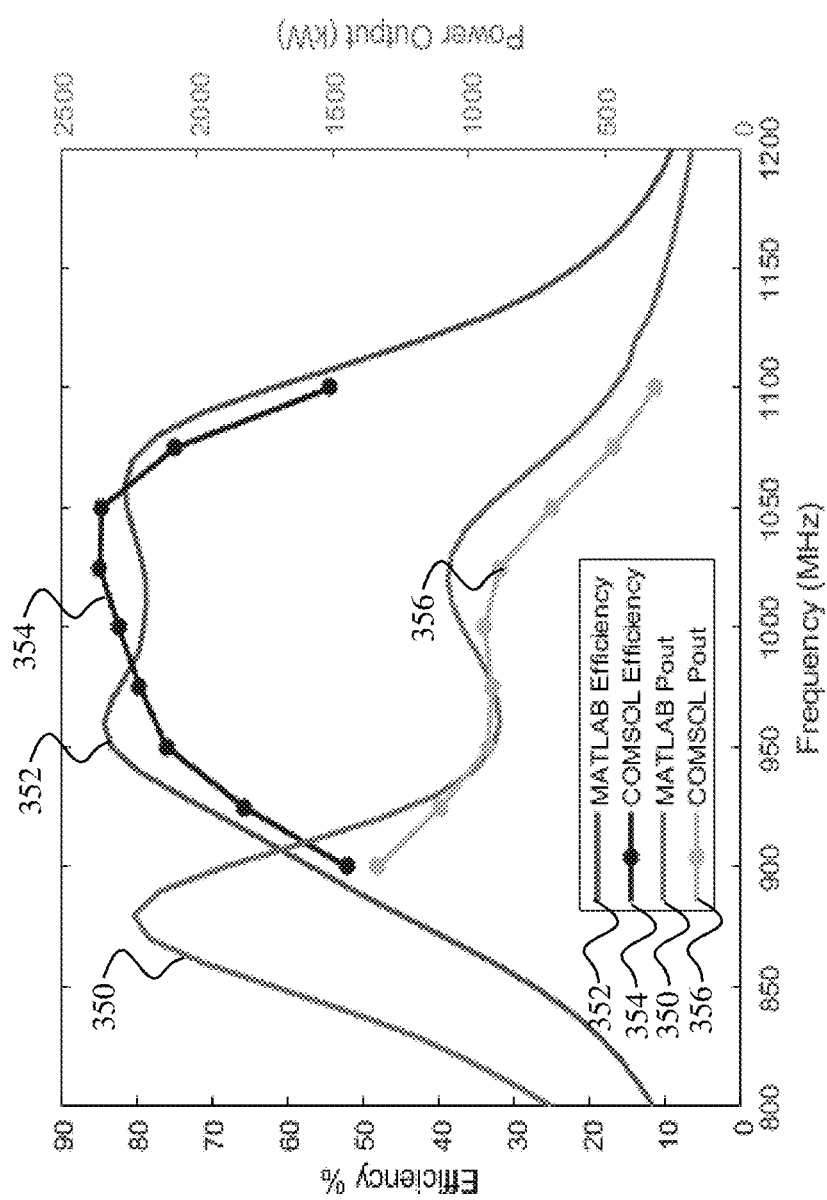
FIG. 3B depicts examples of performance characteristics of an implementation of FIG. 3A.

FIG. 3B depicts examples of performance characteristics of an implementation of FIG. 3A. The performance characteristics can be simulated, determined using analytical tools, or measured in a lab. Shown in FIG. 3B are the drain efficiency as a percentage (352, 354), and the power output (350, 356), both as a function of frequency. For both metrics, analytical results using MATLAB and simulation results using a full-wave electromagnetic solver (COMSOL) are shown. The close match between the simulated results and analytical results indicate that the circuit model is correct. Other analytical tools and/or electromagnetic solvers could also be used.

Figure 4A:
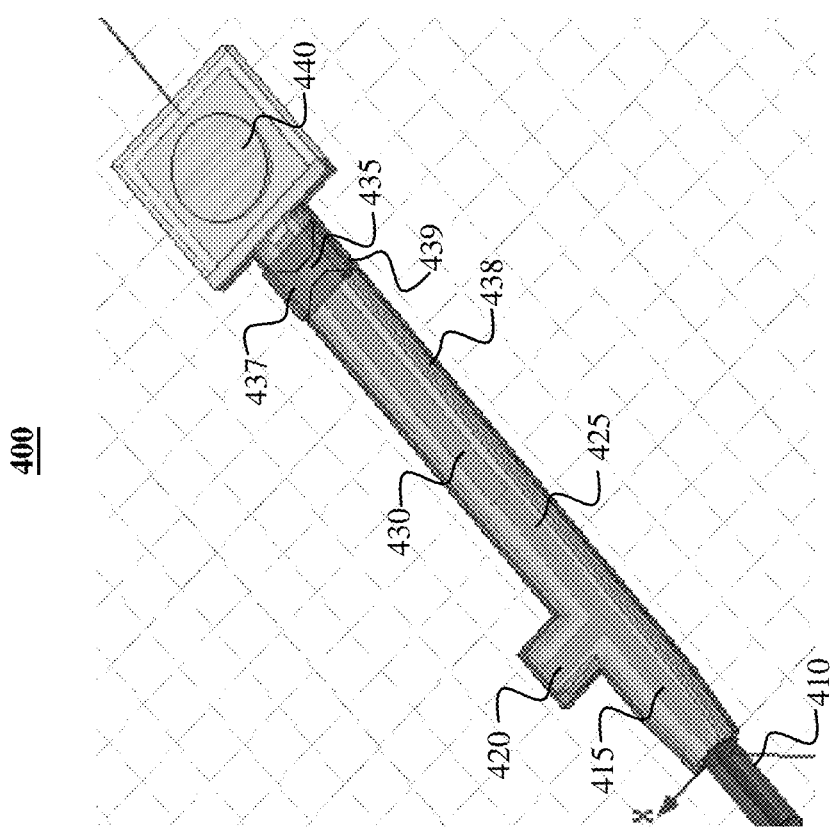
FIG. 4A depicts an example of a conductance modulated amplifier including a single switch.

FIG. 4A depicts an example 400 of a conductance modulated amplifier including a single switch. In the example of FIG. 4A, microwave output power is produced at output port 410. Capacitor bank 440 is charged by a high voltage power supply (not shown). The signal conductor of stripline transmission line 430 is connected to the high voltage power supply. Photoconductive switch 435 is connected to ground on a first side of the photoconductive switch and connected to the signal conductor of stripline transmission line 430 on the second side of photoconductive switch 435. The first side of the photoconductive switch is connected to ground through tapered line 437 which may be fabricated on a small board as shown and attached to the first side of photoconductive switch 435. Tapered line 437 reduces the capacitance and inductance to ground of the first side of the switch. The tapered line 437 makes contact to ground at the lateral edges 439 of the tapered line 437. The waist of the tapered line 437 matches the approximate size of the photoconductive switch. The photoconductive switch can be switched by an optical signal (not shown) coupled to the photoconductive switch 435. Transmission line 430 is capacitively coupled to transmission line 425. A stub tuner 420 is positioned at the junction of transmission line 425 and transmission line 415. Similar to FIG. 3A, transmission lines 415 and 425 may be considered two transmission lines with stub tuner 420 at the junction or a single transmission line with stub tuner 420 at a location along the length. Output port 410 is coupled to transmission line 415. The circuit in FIG. 4A is placed into a conductive enclosure 438 that is connected to AC ground and DC ground for the circuit and contains an insulating fluid which increases the voltage handling capability of the circuit.

Figure 4B:
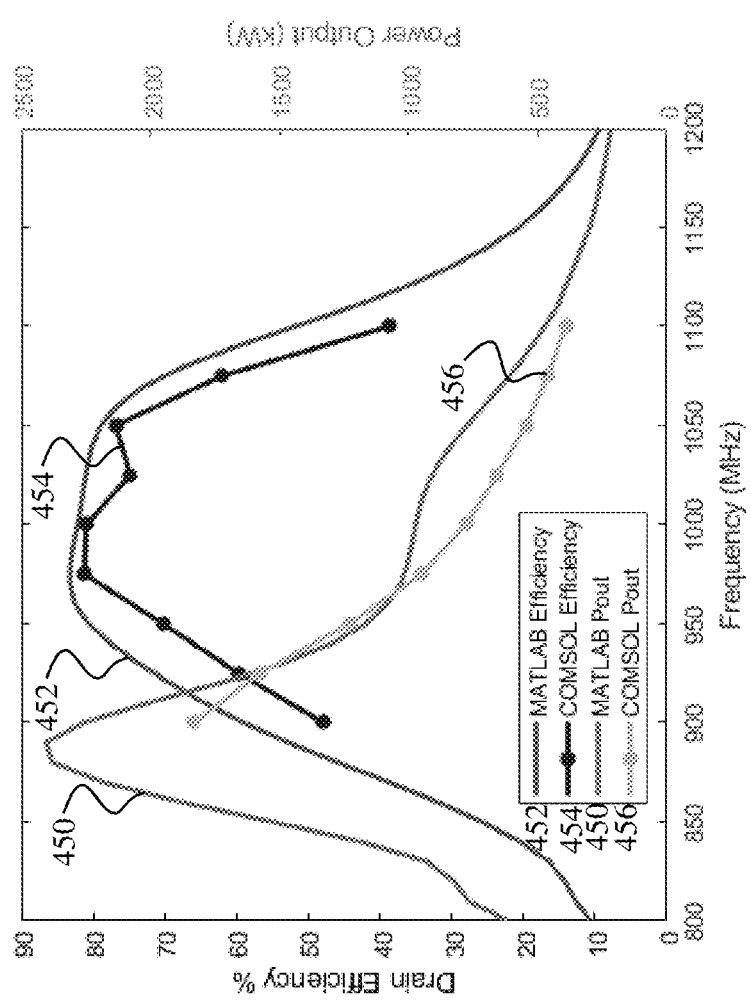
FIG. 4B depicts examples of performance characteristics of an implementation of FIG. 4A.

FIG. 4B depicts examples of performance characteristics of an implementation of FIG. 4A. Shown are the drain efficiency (452, 454) and the power output (450, 456), both as a function of frequency.

Figure 5A:
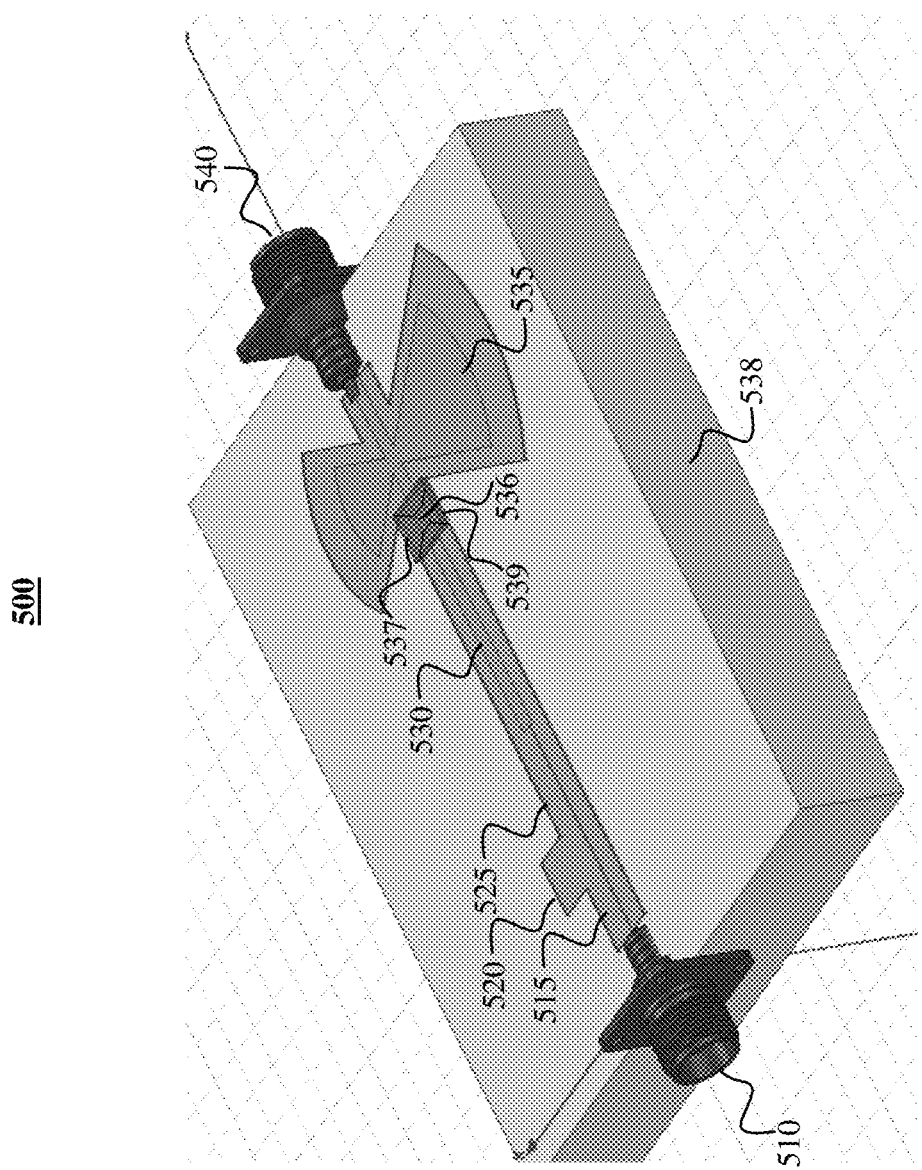
FIG. 5A depicts an example of a conductance modulated amplifier including a single or double switch.

FIG. 5A depicts an example 500 of a conductance modulated amplifier designed using the disclosed methodology including a single or double photoconductive switch. In the example of FIG. 5A, microwave output power is produced at output port 510. External to the circuit shown in FIG. 5A and connected to port 540 is a capacitor bank that is charged by a high voltage power supply and connects to the signal conductor of transmission line 530. The photoconductive switch(es) 536 is connected to ground on a first side of the photoconductive switch and connected to the signal conductor of transmission line 530 on the second side of the photoconductive switch. The first side of the photoconductive switch is connected to ground through tapered line 537 which may be fabricated on a small board as shown and attached to the first side of photoconductive switch 536 on one side and attached to the grounded enclosure 538 on the other side. Tapered line 537 reduces the capacitance and inductance to ground of the first side of the photoconductive switch. The tapered line 537 makes contact to ground at the lateral edges 539 of the tapered line 537. The waist of the tapered line 537 matches the approximate size of the photoconductive switch 536. The photoconductive switch can be switched by an optical signal (not shown) coupled to the photoconductive switch(es). Fan stub tuner 535 has a shape that is tapered where it interfaces with transmission line 530 and expands to a wider width away from transmission line 530. Fan stub tuner 535 tunes out series inductance in the circuit. Fan stub tuner 535 may also be referred to as a radial stub tuner, bowtie stub tuner, or butterfly stub tuner. Transmission line 530 is capacitively coupled to transmission line 525. Stub tuner 520 is positioned at the junction of transmission line 525 and transmission line 515. Similar to FIGS. 3A and 4A above, transmission lines 515 and 525 may be considered two transmission lines with stub tuner 520 at the junction or a single transmission line with stub tuner 520 at a location along the length. Output port 510 is coupled to transmission line 515. In some example embodiments, a capacitor bank for high voltage charging can be included on one end of the module and the output to a coaxial cable is on the opposite side. Simulation results from this design, which has been configured for a stacked, double-switch configuration show that this design approach can achieve very high electrical efficiency values while maintaining high power output (e.g., 1 MW). The circuit in FIG. 5A is placed into a conductive enclosure 538 that is connected to AC ground and DC ground for the circuit and contains an insulating fluid which increases the voltage handling capability of the circuit.

Figure 5B:
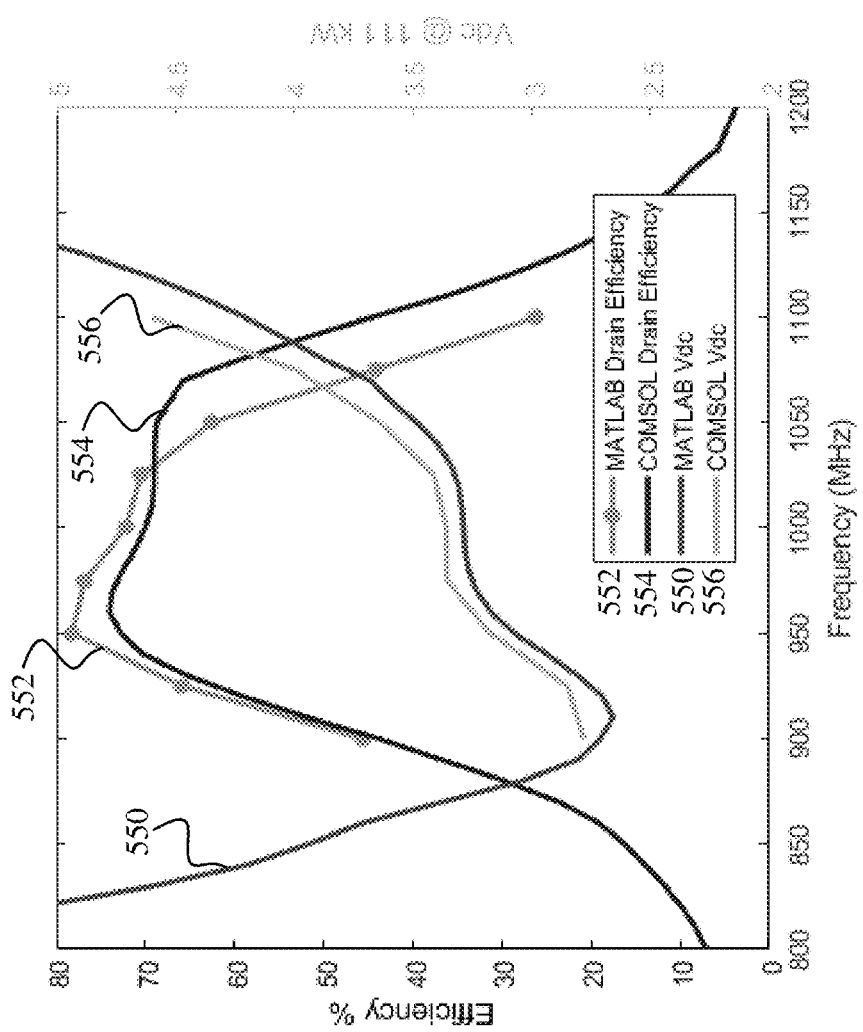
FIG. 5B depicts examples of performance characteristics of an implementation of FIG. 5A.

FIG. 5B depicts examples of performance characteristics of an implementation of FIG. 5A. Shown are the drain efficiency (552, 554) and the power output (550, 556), both as a function of frequency.

In the examples of FIGS. 3A, 4A, and 5A, the transmission lines are shown to have particular lengths, and relative lengths between transmission lines, and stub tuner lengths. The transmission line lengths, stub tuner lengths, and fan stub shape can be tuned by the optimization process detailed in the present patent application.

To short AC components from the capacitor bank, as well as prevent RF leakage into the high voltage power source, a high capacitance AC short can be inserted between the stripline and capacitor bank. Alternatively, a double fan stub can be used.

The excitation of the photoconductive switch affects the agility of the optical pulse former such as the optical pulse former shown in FIG. 1A. Rather than relying on a continuous pulse excitation, the disclosed amplifier design employs an electro-optic modulator which can adjust the output laser waveform as a function of an arbitrary electronic signal input (e.g. a specified waveform for an arbitrary waveform generator, a signal generator, electronic circuit capable of linear frequency modulation). The electro-optic modulator and the high efficiency amplifier circuit provide high efficiency, high power, agile waveform transmission.

The examples shown in FIGS. 3A, 4A, and 5A can be fabricated using a double-sided printed circuit board (PCB) material housed in a conductive enclosure. For example, the circuits in FIGS. 3A, 4A, and 5A can be fabricated on a PCB and the tapered lines in FIGS. 4A and 5A can be produced on additional small PCBs. The PCBs can be placed into a conductive enclosure filled with an insulation fluid to improve voltage handling as detailed above. Other types of boards with different dielectrics or different numbers of layers can also be used. Circuit elements which tune the impedance response at the appropriate frequencies include stripline capacitors, tuning stubs, and lumped element components.

The disclosed technology has broad utility for commercial and defense spaces. Due to the agile nature of the optical waveform generation, the frequency of operation and bandwidth can be adjusted such that the PCSS-based amplifier design can be used for long-range electromagnetic propagation for radar, wireless communication systems, and many other systems.

Figure 6:
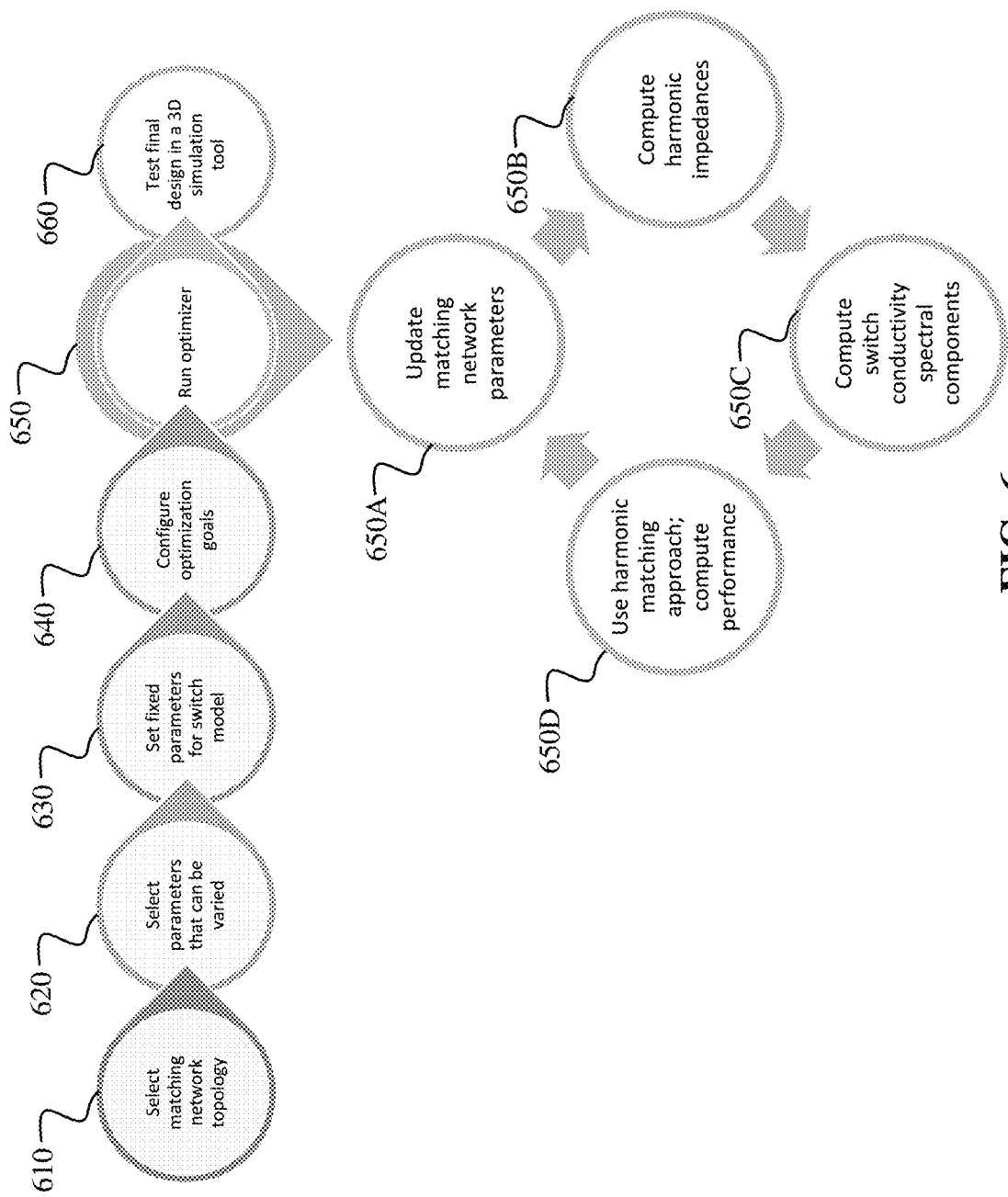
FIG. 6 depicts a process, in accordance with some example embodiments.

FIG. 6 depicts a process, in accordance with some example embodiments. The process can be used to design a high-efficiency power amplifier. At 610, a power amplifier circuit topology is selected including one or more photoconductive switches and locations for the switches in the circuit topology and a matching network including one or more matching stubs and their lengths, one or more transmission lines, and any lumped element(s), or distributed element matching structures. At 620, a determination is made as to which parameter values can be varied such as lengths of transmission lines and matching stubs, transmission line impedance values, lumped element types and values. At 630, photoconductive switch parameters are specified such as switch capacitance, inductance(s), conductivity as a function of time. Some switch parameters may be determined based on analytical results or based on electromagnetic simulation. At 640, optimization goals are selected which include one or more of an efficiency, a gain, a linearity, or a bandwidth. How efficiency is determined is also selected. For example, drain efficiency, power added efficiency, total efficiency, or other efficiency metric or a combination of efficiency metrics can be used. At 650, the parameter values that can be varied are adjusted in an optimization process. At 650A, the switch matching network parameters are updated or set to initial values for the first iteration. At 650B, the harmonic impedances seen by the switch are determined for the current set of matching network parameter values. At 650C, the switch conductivity is determined at the spectral harmonics. At 650D, output voltage and switch power consumption are computed using a harmonic balance approach as described above. At 660, when the optimizer converges on a satisfactory result, a layout of the final design is constructed and tested in a full wave electromagnetic simulation tool.

Figure 7:
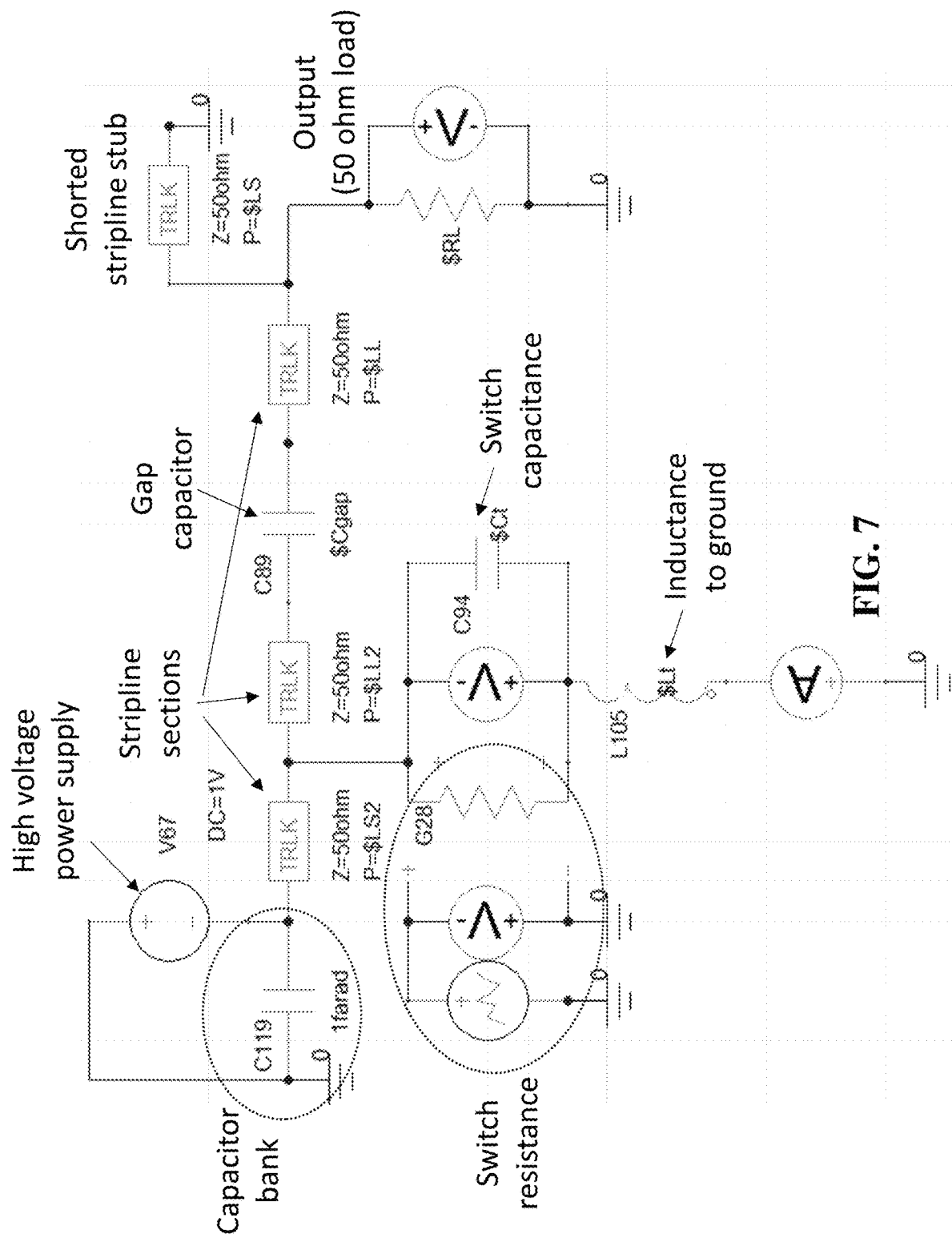
FIG. 7 depicts an example of an amplifier circuit model instantiated in a circuit simulation tool.

FIG. 7 depicts an example of an amplifier circuit model instantiated in a circuit simulation tool similar to the circuits described above. For example, the circuit model in FIG. 7 can be used to model the circuits in FIGS. 3A, 4A, and/or 5A and generate the results shown in FIGS. 3B, 4B, and/or 5B.

Using the process disclosed in this patent document, high efficiency RF, microwave, and millimeter-wave power amplifiers can be designed and built. Examples are described in FIGS. 1A, 3A, 4A, and 5A. The design process includes the process detailed above with respect to FIG. 6 that includes optimizing circuit parameters of a selected circuit topology at a fundamental frequency and harmonics of the fundamental.

The subject matter described herein may be embodied in systems, apparatus, methods, and/or articles depending on the desired configuration. For example, the systems, apparatus, methods, and/or articles described herein can be implemented using one or more of the following: electronic components such as transistors, inductors, capacitors, resistors, transmission lines, and the like, a processor executing program code, an application-specific integrated circuit (ASIC), a digital signal processor (DSP), an embedded processor, a field programmable gate array (FPGA), and/or combinations thereof. These various example embodiments may include implementations in one or more computer programs that are executable and/or interpretable on a programmable system including at least one programmable processor, which may be special or general purpose, coupled to receive data and instructions from, and to transmit data and instructions to, a storage system, at least one input device, and at least one output device. These computer programs (also known as programs, software, software applications, applications, components, program code, or code) include machine instructions for a programmable processor and may be implemented in a high-level procedural and/or object-oriented programming language, and/or in assembly/machine language. As used herein, the term "machine-readable medium" refers to any computer program product, computer-readable medium, computer-readable storage medium, apparatus and/or device (for example, magnetic discs, optical disks, memory, Programmable Logic Devices (PLDs)) used to provide machine instructions and/or data to a programmable processor, including a machine-readable medium that receives machine instructions. In the context of this document, a "machine-readable medium" may be any non-transitory media that can contain, store, communicate, propagate or transport the instructions for use by or in connection with an instruction execution system, apparatus, or device, such as a computer or data processor circuitry. A computer-readable medium may comprise a non-transitory computer-readable storage medium that may be any media that can contain or store the instructions for use by or in connection with an instruction execution system, apparatus, or device, such as a computer. Furthermore, some of the embodiments disclosed herein include computer programs configured to cause methods as disclosed herein.

Although a few variations have been described in detail above, other modifications or additions are possible. In particular, further features and/or variations may be provided in addition to those set forth herein. Moreover, the example embodiments described above may be directed to various combinations and subcombinations of the disclosed features and/or combinations and subcombinations of several further features disclosed above. In addition, the logic flow depicted in the accompanying figures and/or described herein does not require the particular order shown, or sequential order, to achieve desirable results. Other embodiments may be within the scope of the following claims.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for optimizing a power amplifier, comprising:
    selecting a circuit topology for the power amplifier including one or more photoconductive switches and an impedance matching network including one or more parameter values representative of the impedance matching network or the photoconductive switches that can be adjusted;
    selecting one or more optimization goals for the impedance matching network and the one or more photoconductive switches; and
    adjusting the one or more parameter values according to the one or more optimization goals, wherein the one or more optimization goals comprise an efficiency at a particular power output.

2. The method of claim 1, wherein the circuit topology includes one or more circuit locations for the one or more photoconductive switches and the impedance matching network includes one or more matching stubs, one or more transmission lines, and one or more lumped or distributed matching structures.

3. The method of claim 1, wherein the one or more parameter values include at least one of:
    a transmission line length;
    a transmission line impedance;
    a matching stub length, matching stub location, or matching stub impedance;
    a lumped element value; or
    a distributed element impedance.

4. The method of claim 1, wherein the one or more parameter values include a switch capacitance, a switch inductance, and a conductivity as a function of time for the one or more photoconductive switches.

5. The method of claim 1, wherein the one or more optimization goals further comprise:
    a gain,
    a linearity, or
    a bandwidth.

6. The method of claim 1, wherein the adjusting comprises:
    determining an impedance of the impedance matching network at a fundamental frequency and a plurality of harmonics of the fundamental frequency;
    determining a conductivity for each of one or more photoconductive switches at the fundamental frequency and the plurality of harmonics; and
    determining an output voltage and a power amplifier power consumption using a harmonic balance approach.

7. A method for optimizing a power amplifier, comprising:
    determining an impedance of an impedance matching network at a fundamental frequency and a plurality of harmonics of the fundamental frequency, the impedance matching network belonging to a circuit topology of the power amplifier that further includes one or more photoconductive switches;
    determining a conductivity for each of the one or more photoconductive switches at the fundamental frequency and the plurality of harmonics;
    determining an output voltage and a power amplifier power consumption using a harmonic balance approach; and
    adjusting one or more parameter values representative of the impedance of the impedance matching network, the conductivity for each of the one or more photoconductive switches, the output voltage, or the power amplifier power consumption according to one or more optimization goals.

8. The method of claim 7, wherein the circuit topology includes circuit locations for the one or more photoconductive switches and the impedance matching network includes one or more matching stubs, one or more transmission lines, and one or more lumped or distributed matching structures.

9. The method of claim 7, wherein the one or more parameter values include at least one of:
    a transmission line length;
    a transmission line impedance;
    a matching stub length, matching stub location, or a matching stub impedance;
    a lumped element value; or
    a distributed element impedance.

10. The method of claim 7, wherein the one or more photoconductive switches is characterized by a switch capacitance, a switch inductance, and a conductivity as a function of time.

11. The method of claim 7, wherein the one or more optimization goals include one or more of an efficiency at a particular power output, a gain, a linearity, or a bandwidth.

12. A microwave power amplifier, comprising:
    one or more photoconductive switches;
    an optical source carrying an optical signal coupled to the one or more photoconductive switches, wherein the optical signal is transformed to an electrical signal by the one or more photoconductive switches; and
    an impedance matching network comprising a plurality of circuit elements connected with the one or more photoconductive switches in a circuit topology, wherein one or more parameter values characterize at least a portion of the circuit elements and the one or more photoconductive switches, and wherein the one or more parameter values are selected to achieve one or more optimization goals.

13. The microwave power amplifier of claim 12, wherein the circuit topology includes circuit locations for the one or more photoconductive switches and the impedance matching network includes one or more matching stubs, one or more transmission lines, and one or more lumped or distributed matching structures.

14. The microwave power amplifier of claim 12, wherein the one or more parameter values include at least one of:
    a transmission line length;
    a transmission line impedance;
    a matching stub length, a matching stub location, or a matching stub impedance of a stub tuner of the microwave power amplifier;
    a lumped element value; or
    a distributed element impedance.

15. The microwave power amplifier of claim 12, wherein the one or more parameter values include a switch capacitance, a switch inductance, and a conductivity as a function of time for the one or more photoconductive switches.

16. The microwave power amplifier of claim 12, wherein the one or more optimization goals include one or more of an efficiency at a particular power output, a gain, a linearity, or a bandwidth.

17. The microwave power amplifier of claim 12, wherein the one or more optimization goals is achieved by:
   determining an impedance of the impedance matching network at a fundamental frequency and a plurality of harmonics of the fundamental frequency;
   determining a conductivity for each of one or more photoconductive switches at the fundamental frequency and the plurality of harmonics;
   determining an output voltage and a power amplifier power consumption using a harmonic balance approach; and
   adjusting the one or more parameter values according to the one or more optimization goals.

18. The microwave power amplifier of claim 14, wherein the stub tuner is a radial stub tuner, a bowtie stub tuner, or a butterfly stub tuner.

\* \* \* \* \*